United States Patent
Nicholls et al.

(10) Patent No.: US 7,593,651 B2
(45) Date of Patent: Sep. 22, 2009

(54) CONTROL OF AVALANCHE PHOTODIODES BIAS VOLTAGE

(75) Inventors: Peter Nicholls, Long Eaton (GB); Graham Butler, Chilwell (GB)

(73) Assignee: Ericsson AB, Stockholm (SE)

( * ) Notice: Subject to any disclaimer, the term of this patent is extended or adjusted under 35 U.S.C. 154(b) by 522 days.

(21) Appl. No.: 10/506,920

(22) PCT Filed: Mar. 11, 2003

(86) PCT No.: PCT/GB03/01028

§ 371 (c)(1),
(2), (4) Date: May 3, 2005

(87) PCT Pub. No.: WO03/079581

PCT Pub. Date: Sep. 25, 2003

(65) Prior Publication Data

US 2005/0222814 A1 Oct. 6, 2005

(30) Foreign Application Priority Data

Mar. 14, 2002 (GB) ................................. 0206053.1

(51) Int. Cl.
*H04B 10/06* (2006.01)
(52) U.S. Cl. ...................................... 398/209; 398/213
(58) Field of Classification Search ......... 398/202–214, 398/27, 9, 154
See application file for complete search history.

(56) References Cited

U.S. PATENT DOCUMENTS

| 5,953,690 | A | 9/1999 | Lemon et al. |
| 6,157,022 | A | 12/2000 | Maeda et al. |
| 6,222,660 | B1 * | 4/2001 | Traa ........................... 398/213 |
| 6,421,077 | B1 * | 7/2002 | Reed, Jr. ..................... 348/21 |

FOREIGN PATENT DOCUMENTS

| EP | 1 168 741 A2 | 1/2002 |
| JP | 01-103334 | 4/1989 |
| JP | 2-230834 | * 9/1990 |
| JP | 3-45046 | 2/1991 |
| WO | WO 01/08422 A2 | 2/2001 |

* cited by examiner

*Primary Examiner*—M. R. Sedighian
(74) *Attorney, Agent, or Firm*—Kirschstein, et al.

(57) ABSTRACT

An optical communications system using forward error correction (FEC) to correct errors in signals carried by the system. Optical signals on the system are dropped at nodes and converted to electrical signals by avalanche photodiodes (APDs) at the node receivers. An FEC chip operates on the electrical signal to correct errors. The error rate is used to control the APD bias voltage which affects signal noise and therefore error rate. The errors in a predetermined interval are counted and a determination made as to whether the error rate is rising with time. The bias voltage is derived from the value of a counter whose count is incremented each interval. If the error rate is rising, the counting direction is changed.

13 Claims, 3 Drawing Sheets

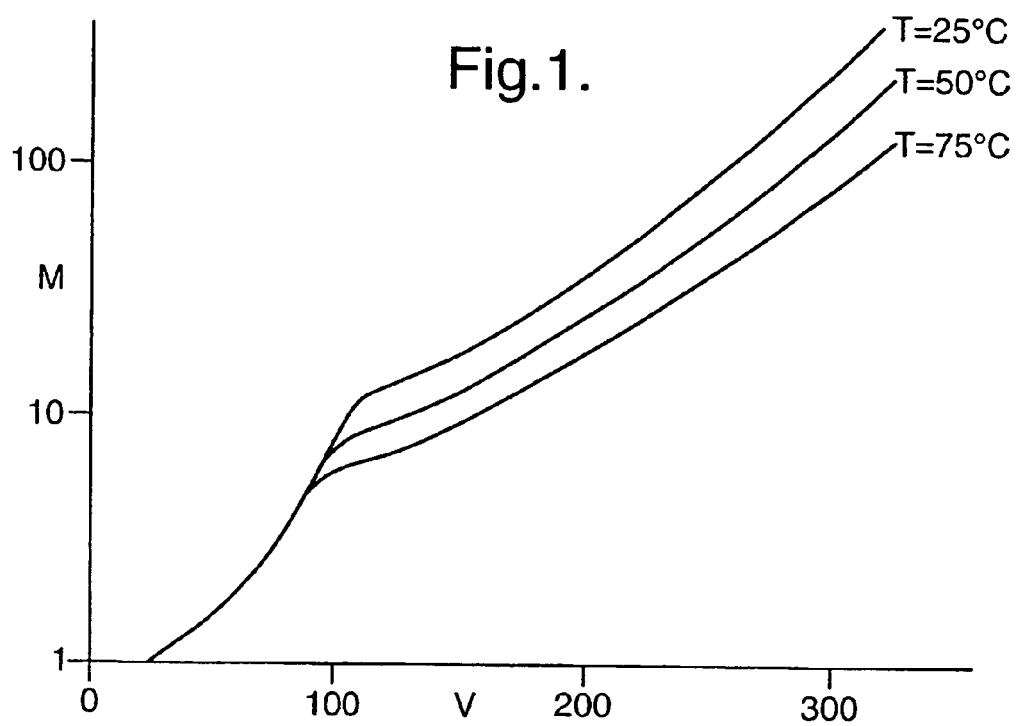
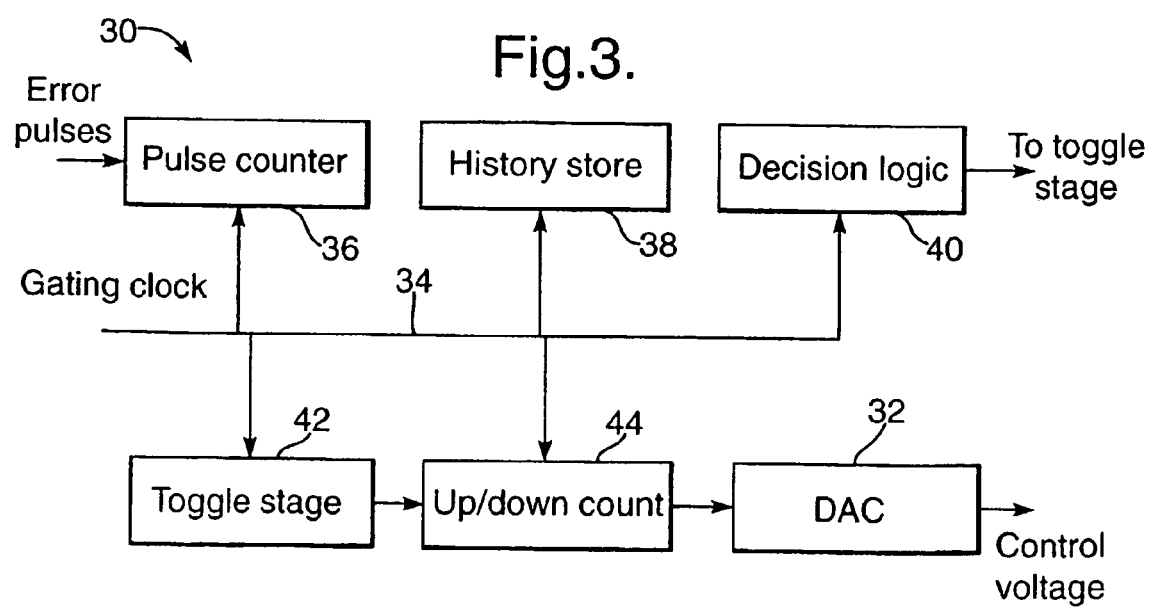

CONTROL OF AVALANCHE PHOTODIODES BIAS VOLTAGE

This invention relates to the control of avalanche photodiodes (APDs). It is particularly concerned with the control of APDs in optical communications circuits.

APDs are widely used in optical communications to convert optical data into an electrical signal. Fluctuations in the received optical signal are converted into sympathetic fluctuations in the electric signal passing through the APD device.

In optical communications systems as in any communications system, noise is a significant factor which affects performance. An optical signal arriving at an APD may have passed through many kilometres of optical fibre and through several associated optical amplifiers. It will, therefore, have collected noise. In addition to the incoming noise component, the APD itself generates electrical noise which constitutes to the overall noise in the signal output by the APD. The noise generated by the APD is superimposed on the electrical current fluctuations in the device generated by the incoming optical signal.

APDs are biased by a reverse voltage in order to function properly. The reverse, or bias, voltage is a supply whose negative terminal is connected to the APD anode and whose positive terminal is connected to the cathode. The bias causes a small leakage current to flow in the device when no light is incident. The current flowing increases with increasing incident light intensity. It is important for good performance of APDs to choose the optimum bias voltage.

Choosing the optimum bias voltage is difficult. It varies between devices, not only between manufacturers but also within a particular batch. Thus, the bias has to be set up accurately when the device is first manufactured. Moreover, the optimum bias value varies with temperature. The bias circuit must therefore monitor local temperature and adjust the bias voltage accordingly.

To obtain good results over the working temperature range, it is necessary to set up the temperature coefficient of the correction circuit at the time of manufacture.

A further problem arises in that APD characteristics change slightly with age. This can result in the non-optimum bias voltage being applied.

Some existing APD bias circuits vary the bias voltage in accordance with the incoming signal strength. However, the improvement in performance offered tends to be small.

The problems of bias voltage control are better appreciated by considering the nature of photodiodes. In conventional, non-avalanche, photodiodes, incident light photons are absorbed by the light sensitive part of the device. For each photon absorption, there is a reasonable chance that a nearby electron will receive some or all that energy. If a suitable electron receives sufficient energy, it may free itself from its silicon atom and become a mobile charge carrier which can travel from atom to atom through the crystal structure of the device. On application of an electric field to the device, the charge carrier will travel towards the positive terminal of the diode where it will be absorbed, giving up its charge to the external circuit and resulting in an impulse of current. If the photosensitive part of the device is exposed to steady illumination there will be a continuous stream of charge carriers and, therefore, an electric current in the external device.

The photosensitivity of the device is created by application of an internal electric field, requiring a voltage to be applied across the diode terminals. As devices are used to convert incident light into electrical current, the voltage bias on the diode must be in the non-conducting, or reverse, direction so that the current generated is only due to the incident light.

In avalanche photodiodes, the active region is thin and the bias voltage particularly high, creating a significantly high electric field strength within the device. Charge carriers produced by incident photons accelerate rapidly towards the positive terminal, gaining energy. If they collide with another atom, they may have gained sufficient energy to liberate two or more electrons. Those newly liberated electrons become charge carriers and accelerate towards the anode. Each electron may, in turn, collide with other atoms and liberate two or more further carriers thus providing an avalanche of charge carriers and amplifying the effect of the incident photon.

The number of charge carriers liberated by a photon is referred to as the gain M of the APD. If one considers a photon which liberates a single carrier, that carrier accelerates and liberates two further carriers. Each of those accelerate and liberate two further carriers, making a total of four. If there are 10 such collisions before reaching the anode, 1024 electrons will give off their charge to the external circuit and so the APD gain, or multiplication factor exhibited is 1024.

The gain is dependent on both the bias voltage and temperature and is highly non-linear as can be seen from FIG. 1 which plots gain against bias voltage for a device operated at three temperatures, 25° C., 50° C. and 75° C. The gain axis is logarithmic.

It will be appreciated that the avalanche process described is statistical in nature and gives rise to various high frequency noise sources within the device. Noise generation is particularly sensitive to the value of M and hence to the bias voltage and temperature.

If one considers a system with a fibre optic transport mechanism such as a fibre-optic cable, an APD device and a low-noise high frequency amplifier, the amplifier is referred to as a transimpedance amplifier as it converts current fluctuations into a voltage signal. It can be shown that optimum performance is achieved when $$N_T = N_F + N_A$$

where $N_T$ is the noise contribution due to the transimpedance amplifier, $N_F$ is the noise contribution due to the optical fibre and $N_A$ is the noise contribution due to the APD device. All the figures should refer to the same position in the system, that is the amplifier output. $N_T$ is constant, $N_F$ depends on the incoming optical signal and is therefore outside the control of the optical receiver. It therefore follows that optimum performance can only be achieved by adjusting $N_A$ which, in turn, is achieved by adjusting the bias voltage on the APD device.

Bearing in mind the importance of bias control in APD devices, and the problems and difficulties in achieving optimum control of bias voltage there is a need for improved APD bias voltage control. The present invention aims to address that need and the problems and difficulties discussed above.

The invention resides in the use of measured error rates in the signal to set the bias voltage using a feedback loop.

More specifically there is provided a method of controlling the bias voltage of an avalanche photodiode in an optical communications system including forward error correction, the method comprising measuring the error rate in a electrical signal converted from an optical signal by the avalanche photodiode, and adjusting the bias voltage applied to the avalanche photodiode to minimise the error rate in the electrical signal.

The invention also provides apparatus for controlling the bias voltage of an avalanche photodiode (APD) in an optical communications system including forward error correction (FEC), comprising an error rate measurer for measuring the error rate in an electrical signal converted from an optical signal by the APD, and is an adjustment circuit for adjusting the bias voltage applied to the APD to minimise the measured error rate.

Embodiments of the invention have the advantage that the APD bias voltage can be optimised or near optimised under normal operating conditions. It removes the need to set up the APD voltage accurately during manufacture and removes the need for a highly accurate and temperature compensated APD voltage supply.

Preferably the error rate is measured over a number of sample periods and a determination made as whether the error rate is increasing or decreasing with time. By making this determination over several sample periods, short term fluctuations in the error rate do not affect the bias voltage setting.

Preferably the bias voltage is set by the value of a counter which is incremented every sample period. If the error rate is increasing, the counting direction is changed. In this way, the count tends to the optimum valve of the bias voltage. The counter is preferably initially set to a mid point.

Preferably, the sample interval is variable. This may be in accordance with the measured error rate whereby the bias voltage is changed rapidly when it is a long way from the optimum value and more slowly as it approaches the optimum value.

A preferred embodiment of invention comprises a pulse counter which counts errors detected by the forward error corrector over a time interval set by a gating clock. At each new interval, the existing pulse count is switched to a store and the pulse count starts again. After a number of counts have been stored, for example 6, decision logic determines whether the error rate is increasing or decreasing using an algorithm. An up down counter is set at a mid-point and determines the value of the bias voltage. The count is incremented or decremented each time interval. If the error rate is determined to be increasing, the count direction is changed. If the error rate is decreasing the count direction is unchanged. The output of the counter is converted to an analog signal by a D to A converter and forms the bias voltage which is applied to the APD.

Embodiments of the invention will now be described, by way of example only, and with reference to the accompanying drawings in which:

FIG. 1, referred to above, is a graph of gain against bias voltage for an APD operating at three temperatures;

FIG. 3 is a block diagram of a system embodying invention; and

Figure 2:
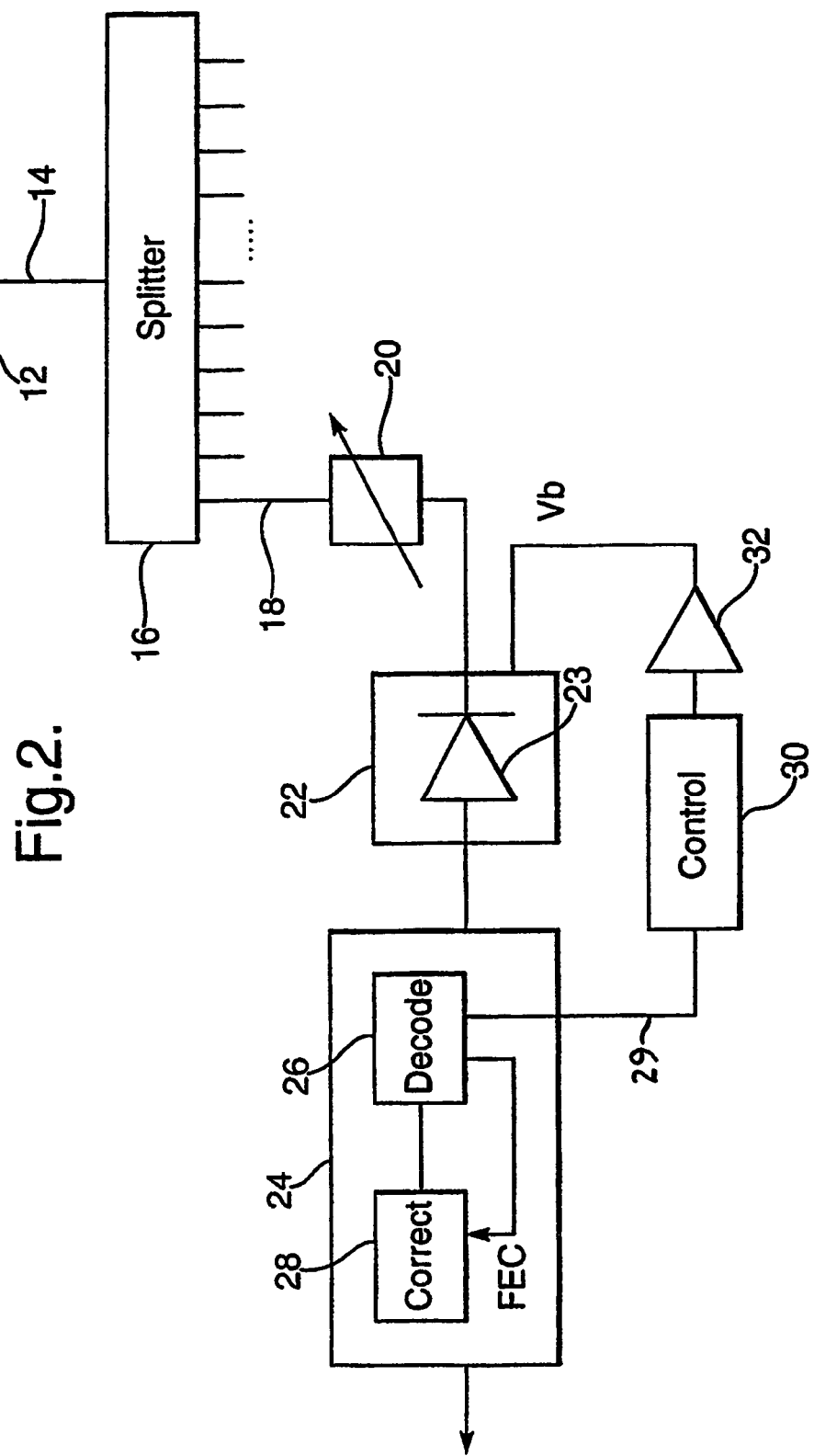
FIG. 2 is a schematic representation of a portion of an optical communications network showing the use of APDs and forward error correction.

FIG. 2 shows, schematically, the drop side of a node of an optical network, for example a two fibre 10 GHz optical network which carries a 32 channel DWDM (Dense Wave Division Multiplex) signal. The optical DWDM signal is split from the network by a signal splitter 12 to produce a dropped signal output 14. The other output of the splitter is through traffic, labelled T, which remains on the network. The dropped signal is passed to a 32:1 splitter 16 which splits the signal into 32 separate signals. The remaining circuitry shown applies to one of the outputs only, although, in practice, it is repeated for each channel.

The output from signal splitter 16 is input to a tuneable filter 20. The filter is an essentially mechanical component whose centre frequency is controlled by a servo motor.

The output of the filter 18 is a single channel optical signal which is input to a receiver 22 which includes an APD 23 which converts the optical signal into an electrical signal which is then output for further processing and, eventually, delivered to the end user.

A part of the further processing is error correction. It is well known in optical communications networks to use forward error correction as a means of correcting data errors. A degree of redundant coding is introduced into the data stream according to one of a number of coding algorithms. One such algorithm is the Reed-Solomon algorithm which is a block based error correction code which encodes an array of K data symbols as an input and returns an array of N symbols. Operating in a 10 GHz environment, a Reed-Solomon encoder will convert a 9.9 Gbps symbol stream into a 10.7 Gbps stream.

The electrical output from the receiver 22 is passed to a Forward Error Correction (FEC) chip 24 which comprises two main parts. A decoder 26 decodes the electrical data symbols and a corrector 28, which operates under the control of correction data from the decoder 26, corrects the decoded data. The corrected data is then output to its intended destination.

FEC has the advantage of being transparent to the end user. We have appreciated that if the error rate in the symbol stream varies, provided that error rate is not excessive, the errors will be corrected and the end user will be unaware of the fluctuations in the error rate. We have further appreciated that changes in the error rate can be monitored to find the optimum bias voltage for the APD 23.

Thus, in FIG. 2, error pulses 29 from the decoder provide an input to a control unit 30 which outputs a signal which, after conversion by a digital-to-analog convertor DAC 32 provides the bias voltage $V_b$ to the avalanche photodiode 23.

FIG. 3 shows the controller 30 of FIG. 2 in more detail. The error pules received from the FEC chip correspond to data errors that have been detected and will be corrected before being passed on to the end user. A gating clock 34 (not shown in FIG. 2) provides periodic ticks which determine the points in time when the circuiting reevaluates its internal calculation.

The error pulses are first counted by a pulse counter 36 between clock ticks. At each clock tick, the current counter value is transferred to a history store 38. The counter 36 is then reset for the next counting interval. The store 38 records most recent error counts. The store may be based on a shift register architecture although other architectures are possible. On each clock tick it shifts-in the most recent sample from the pulse counter and discards the oldest one. Typically, the store will retain the six most recent samples although other values may be used.

Decision logic 40 is used to determine whether the error count is increasing or decreasing over time. This may be done in any convenient manner although one presently preferred method is by an algorithm using six consecutive samples and simple Gaussian filters for samples E1, to E6 where E1 is the most recent. The error rate would be increasing, in which case the performance is getting worse if:

Getting worse: $(E_1+2E_2+E_3)>(E_4+2E_5=E_6)$.

The result 'getting worse' is a boolean quantity and is true or false (1 or 0). At each clock tick, a true value causes a toggle stage 42 to change state, but a false value causes the toggle to remain unchanged. The toggle stage outputs to an up/down counter 44 which is also clocked by the clock 34 and clocks up or down depending on the value of the toggle stage. An increasing error rate will therefore cause the counter to change direction at each clock tick, whereas a falling or consistent error rate will cause it to keep ramping in the same direction.

The current count value is connected by DAC 32 into the analogue bias voltage $V_b$ which in then applied to the APD anode. The counter 33 will be set to an initial value which provides the bias voltage and is incremented, up or down, every clock tick in accordance with the toggle state.

The response speed of the control loop is determined by the speed of the gating clock 34 and the size of the up/down counter 44 for a tick interval to and an N-bit up/down counter, together with an N-bit D/A converter 32. It will take $2^{N-1}t$ seconds to change the APD voltage from its mid-point value to an excursion extremity. Thus, an 8 bit counter and a sample range of 60 ms will take 6.4 seconds to perform the excursion. The purpose of the loop is to trim accurately a voltage which depends on slow-moving or static parameters, so such a long time constant is acceptable.

The pulse counter 36 must be chosen to have a size that is large enough to capture sufficient errors under the worst possible bit error rate consistent with proper system operation. The system may include an error rate monitor (not shown) which can identify an excessive error rate condition.

Initially, the up/down counter is set to its mid point value. This allows equal trimming above and below the initial set point. This enables a typical working bias voltage to be presented to the APD device.

If a fault condition develops, the error rate may increase to a value which is too high to enable the system to obtain a realistic performance indication. If such a high error rate is detected. The output voltage from DAC 32 may be pre-set to the mid-point value. This may be achieved under the control of the error rate monitor.

Excessive bias or excessive current can damage the sensitive and expensive APDs and a controller may be used to limit there parameters to safe working values.

Figure 4:
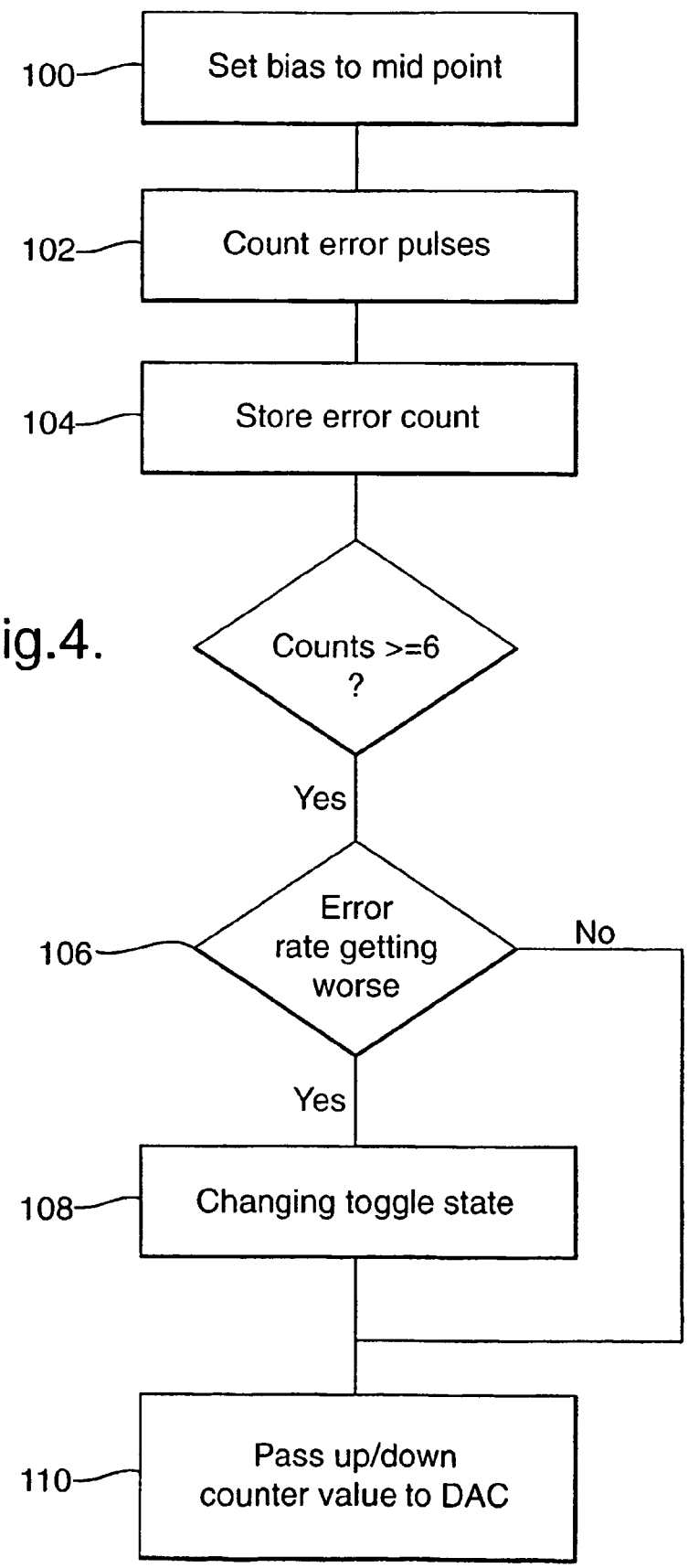
FIG. 4 is a flow chart showing how bias voltage can be optimised.

FIG. 4 shows the process described above as a flow chart. At step 100 an initial bias voltage is set at a typical mid point value. This may be obtained from a look up table. At step 102, the error pulses from the FEC chip are counted by pulse counter 36. At step 104, on the next tick, the contents of the counter are passed to store 38. Steps 102 and 104 are continuously repeated. After six counts, the decision logic at 106 applies the algorithm described above to determine whether the error rate is getting worse or not. If it is, the toggle state is changed at 108 and the count direction of the up/down counter 44 is changed. At step 110, the output of the up/down counter 44 is read, and passed to the DAC for application as the bias control voltage to the APD.

In the embodiment described, the APD bias voltage is adjusted by a small, trial, voltage at regular intervals and the FEC error rate monitored in the previous and current samples. A determination is made as to whether the error performance is getting better or worse. If it is getting worse, the polarity of the voltage increment is adjusted.

Embodiments of the invention have the advantage that overall system performance can be improved as the APD will always be operated with the optimum or near-optimum bias voltage regardless of temperature changes or ageing effects. As a consequence, there is no need to set up the APD accurately during manufacture or to have a highly accurate and temperature compensated APD bias voltage supply.

The embodiment described may be modified in various ways without departing from the scope of the invention. For example, a variable tick rate or clock may be used. This has the advantage of speeding up the initial convergence on the optimum bias voltage whilst improving the resolution, and so the accuracy, when close to the correct optimum bias voltage. A short tick rate can be used when error counts are high, rapidly pushing the circuit to its final solution. When error rates are low, the circuit is accurately nudged to its ultimate convergence. Multiple rates may be used.

In one embodiment, clock rates of 10, 20, 40, 80 and 160 ms may be used. If more than 32 errors are constantly encountered in one clock interval, the interval, if not already the lowest, is halved. If less than 8 errors are counted in the clock interval, the interval, if not already the highest, is doubled. Other values may, of course, be used.

In a further modification, the up/down counter may be inhibited if no errors are counted. This prevents a constant hunting around the optimum operating bias voltage. If error free operation is achieved, the loop would freeze and error-free operation would be maintained until the external conditions change.

Various other modifications are possible and will occur to those skilled in the art without departing from the invention which is limited only by the following claims.

The invention claimed is:

1. A method of controlling a bias voltage of an avalanche photodiode in an optical communications system including forward error correction, the method comprising the steps of:
   a) measuring an error rate in an electrical signal converted from an optical signal by the avalanche photodiode over a plurality of sample periods;
   b) adjusting the bias voltage applied to the avalanche photodiode to minimize the error rate in the electrical signal by determining whether the error rate is increasing or decreasing with time;
   c) determining the bias voltage by a value of a counter which is incremented or decremented every sample period, and changing a count direction of the counter if the error rate is increasing with time; and
   d) inhibiting movement of a counter if the error rate is zero.

2. The method according to claim 1, and determining the sample period by a clock tick of the clock.

3. The method according to claim 2, and varying an interval between clock ticks of the clock.

4. The method according to claim 3, wherein the interval between the clock ticks varies in dependence on the measured error rate.

5. The method according to claim 4, wherein there is a plurality of possible lengths of the interval, and selecting the interval of increased length if the error rate is below a first level, and of decreased length if the error rate is above a second level.

6. An apparatus for controlling a bias voltage of an avalanche photodiode (APD) in an optical communications system including forward error correction (FEC), comprising: an error rate measurer for measuring an error rate in an electrical signal converted from an optical signal by the APD; and an adjustment circuit for adjusting the bias voltage applied to the APD to minimize the error rate, the adjustment circuit comprising decision logic for determining whether the error rate is increasing or decreasing with time, and a counter, a counter value of which determines a level of the bias voltage, and means for changing a count direction of the counter if the decision logic determines that the error rate is increasing with time, and an inhibitor for inhibiting movement of the counter if the error rate is zero.

7. The apparatus according to claim 6, wherein the means for changing the count direction is a toggle.

8. The apparatus according to claim 7, comprising a digital to analog converter for converting the counter value to an analog APD bias voltage.

9. The apparatus according to claim 8, wherein the adjustment circuit comprises an error pulse counter for counting error pulses over a predetermined interval, and a store for holding error counts for a plurality of earlier intervals.

10. The apparatus according to claim 9, wherein the decision logic operates on the error counts held in the store.

11. The apparatus according to claim 10, comprising means for varying the interval over which error pulses are counted.

12. The apparatus according to claim 11, wherein the interval varying means varies the interval in dependence on the error rate.

13. The apparatus according to claim 12, wherein the interval varying means varies the interval between one of a plurality of different interval lengths.

* * * * *